United States Patent [19]

Sartwell et al.

[11] Patent Number: 4,952,863
[45] Date of Patent: Aug. 28, 1990

[54] VOLTAGE REGULATOR WITH POWER BOOST SYSTEM

[75] Inventors: Alfred L. Sartwell, Jericho; Endre P. Thoma, Colchester, both of Vt.

[73] Assignee: International Business Machines Corporation, Armonk, N.Y.

[21] Appl. No.: 454,097

[22] Filed: Dec. 20, 1989

[51] Int. Cl.$^5$ ............................................. G05F 1/56
[52] U.S. Cl. .................................. 323/280; 307/263; 307/296.8; 320/1; 330/253
[58] Field of Search ..................... 323/273, 280, 281; 330/253; 365/226; 307/263, 296.3, 296.8

[56] References Cited

U.S. PATENT DOCUMENTS

| | | | |
|---|---|---|---|
| 3,437,912 | 4/1969 | Morris | 323/22 |
| 4,176,387 | 11/1979 | Harper | 361/154 |
| 4,185,211 | 1/1980 | Kucharewski | 330/253 |
| 4,431,927 | 2/1984 | Eaton, et al. | 307/269 |
| 4,574,232 | 3/1986 | Petty | 323/280 |
| 4,774,691 | 9/1988 | Hidaka | 365/203 |

FOREIGN PATENT DOCUMENTS

| | | | |
|---|---|---|---|
| 170308 | 9/1985 | Japan | 330/253 |
| 120218 | 6/1986 | Japan | |
| 248015 | 10/1987 | Japan | |

Primary Examiner—William H. Beha, Jr.
Attorney, Agent, or Firm—Stephen J. Limanek

[57] ABSTRACT

An improved voltage regulator system is provided which includes a differential amplifier, an output transistor having a control electrode coupled to an output of the differential amplifier and a current carrying electrode fed back to an input of the amplifier, an input control transistor having a first current carrying electrode connected to the control electrode of the output transistor and a second current carrying electrode connected to a point of fixed potential and means for selectively applying a control signal to a control electrode of the input control transistor.

22 Claims, 1 Drawing Sheet

VOLTAGE REGULATOR WITH POWER BOOST SYSTEM

DESCRIPTION

1. Technical Field

This invention relates to integrated semiconductor circuits and more particularly to voltage regulator systems having a power boost circuit.

2. Background Art

Voltage regulators are used for high performance systems, such as high speed dynamic random access memory systems, which are capable of rapidly charging large capacitive loads during selected periods of time while operating at low power at other times.

It is known in the art to, e.g., precharge clock drivers to increase turn-on speed and to minimize power usage during standby conditions. More specifically, in U.S. Pat. No. 4,431,927, filed Apr. 22, 1981, by S. E. Eaton, Jr. et al, there is disclosed a clock generator wherein signals are provided to precharge bootstrap capacitors. In U.S. Pat. No. 4,774,691, filed Nov. 12, 1986, by H. Hidaka, there is disclosed the use of precharge signals to reduce peak currents during the start of bit line operations in a memory. U.S. Pat. No. 4,176,387, filed on Feb. 27, 1978, by P. D. Harper, discloses apparatus for activating and deactivating a device to allow current to flow through a slow current decay path during one period of time and to flow through a fast decay path during another period of time. U.S. Pat. No. 3,437,912, filed on Dec. 30, 1966, by D. Morris, discloses a constant potential power supply wherein a trigger circuit controls a switch to selectively apply charging current to a capacitor.

DISCLOSURE OF THE INVENTION

It is an object of this invention to provide a reliable, compatible and more stable on-chip low voltage regulator system having improved performance which rapidly charges large capacitive loads to given voltages lower than that of the external supply voltage during selected intervals of time while using minimum power during standby periods or at other intervals of time.

In accordance with the teachings of this invention, an improved voltage regulator system is provided which includes a differential amplifier, an output transistor having a control electrode coupled to an output of the differential amplifier and a current carrying electrode fed back to an input of the amplifier and an input control transistor having a first current carrying electrode connected to the control electrode of the output transistor and a second current carrying electrode connected to a point of fixed potential. In a preferred embodiment of the invention, the differential amplifier includes a current mirror, the output transistor is an N-channel field effect transistor with the current carrying electrode being an output of the voltage regulator system and the input control transistor is a P-channel field effect transistor having the second current carrying electrode connected to a positive power supply voltage terminal, with an input signal to a driver circuit coupled to a control electrode of the P-channel field effect transistor, the driver circuit receiving its power supply voltage from the output of the voltage regulator system.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
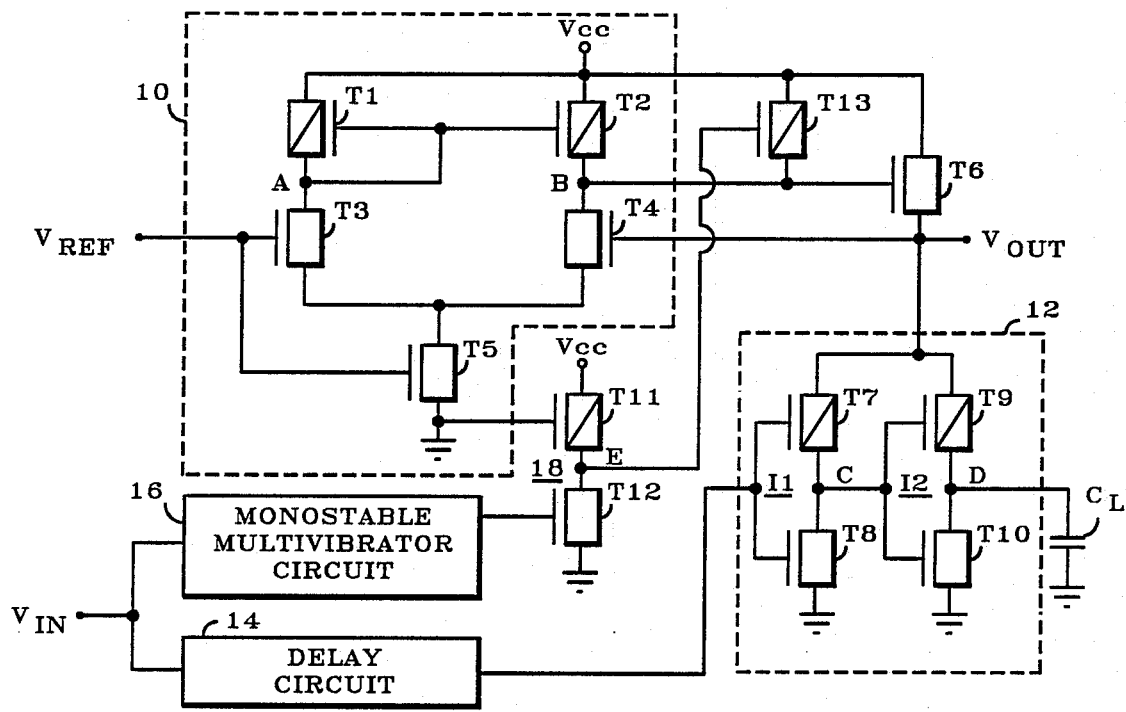
FIG. 1 illustrates a circuit diagram of one embodiment of the voltage regulator system of the present invention, and FIG. 2 indicates voltages plotted against time which occur at various points in the system of FIG. 1 during the operation of the system.

Referring to FIG. 1 of the drawings in more detail, there is illustrated an embodiment of the voltage regulator system of the present invention, preferably made in an integrated semiconductor substrate in complementary metal oxide semiconductor (CMOS) technology, which includes a differential amplifier arranged in the form of a current mirror having P-channel field effect transistors T1 and T2 and N-channel field effect transistors T3, T4 and T5. It should be noted that the CMOS circuits in FIG. 1 of the drawings have P-channel field effect transistors indicated by a rectangle with a diagonal line formed within the rectangle and with a line adjacent and parallel to one side of the rectangle indicating the gate or control electrode of the transistor, and N-channel field effect transistors indicated simply by a rectangle without the diagonal line and with a line adjacent to one side of the rectangle indicating the gate or control electrode of the transistor.

In FIG. 1 of the drawing, the transistor T3 is serially connected with and interposed between transistors T1 and T5, with transistor T1 being connected to a positive voltage power supply terminal Vcc, preferably having a voltage of about 5.0 volts, and with transistor T5 being connected to a point of fixed potential, preferably ground. A control electrode of transistor T1 is connected to the common point or node A between the transistors T1 and T3 and a control electrode of each of the transistors T3 and T5 is connected to a reference voltage terminal Vref having a voltage of preferably 3.5 volts, which may be supplied from any suitable voltage source. Transistors T2 and T4 are also serially connected, with transistor T2 being connected to the power supply terminal Vcc and transistor T4 being connected to the common point between transistors T3 and T5. An N-channel field effect output transistor T6 has a gate or control electrode connected to an output of the differential amplifier 10 at the common point or node B between transistors T2 and T4, with the drain electrode of the transistor T6 connected to the power supply terminal Vcc and the source electrode of the transistor T6 connected to a gate or control electrode of the transistor T4 in a feedback arrangement. The source electrode of the output transistor T6 is also connected to an output terminal Vout having a voltage of about 3.5 volts, which acts as an on-chip low voltage power supply terminal for dense, high speed circuits designed for 3.5 volt operation and formed on the same chip with other circuits designed for 5.0 volt operation, such as the differential amplifier 10.

A low voltage on-chip circuit shown in FIG. 1 of the drawing which uses the output terminal Vout as a power supply terminal is a driver circuit 12 formed as a buffer circuit having first and second inverters I1 and I2, with the inverter I1 including a P-channel field effect transistor T7 serially connected with an N-channel field effect transistor T8 and the inverter I2 including a P-channel field effect transistor T9 serially connected with an N-channel field effect transistor T10. The source electrodes of the transistors T7 and T9 are connected to the output terminal Vout and the source electrodes of the transistors T8 and T10 are connected to a point of reference potential, such as ground. An output of the first inverter I1 at node C is connected to each of the gate or control electrodes of the transistors T9 and T10 of the second inverter I2. The output of the second inverter I2 at node D is connected to a large capacitive load indicated by the capacitor $C_L$. An input terminal Vin is connected to an input of a delay circuit 14 with the output of the delay circuit 14 being connected to each of the gate or control electrodes of the transistors T7 and T8 of the first inverter I1.

Also connected to the input terminal Vin is an input of a monostable or single shot multivibrator circuit 16 which has its output connected to a buffer or inverter stage 18. The inverter stage 18 includes a P-channel field effect transistor T11 serially connected with an N-channel field effect transistor T12, with the source of the transistor T11 being connected to the power supply terminal Vcc and the source of the transistor T12 being connected to a point of reference potential, such as ground. A gate or control electrode of the transistor T11 is connected to a point of reference potential, such as ground, and a gate or control electrode of the transistor 12 is connected to the output of the monostable multivibrator circuit 16. A high power control transistor T13, indicated as a P-channel field effect transistor, has a source electrode connected to the power supply terminal Vcc and a drain electrode connected to the gate electrode of the output transistor T6, with the gate or control electrode of the transistor T13 being connected to the output of the inverter stage 18 at node E.

The operation of the basic voltage regulator shown in FIG. 1 which includes the differential amplifier 10 and the output transistor T6 is well known. A reference voltage, such as 3.5 volts, from any suitable source is applied to the reference terminal Vref and the voltage at the output terminal Vout stabilizes at about 3.5 volts. If the voltage at the output terminal Vout decreases, the N-channel transistor T4 begins to turn off causing an increase in voltage at node B to turn on the N-channel transistor T6 harder, while at the same time more current is being forced through N-channel transistor T3, since transistor T5 acts as a sink transistor or current source, which lowers the voltage at node A turning on the P-channel transistor T2 harder to further turn on harder the N-channel output transistor T6 which is now capable of supplying large amounts of current to the output terminal Vout and raising the voltage at terminal Vout. When the voltage at terminal Vout is raised, the N-channel transistor T4 begins to turn on harder, which lowers the voltage at node B and begins to turn off the N-channel output transistor T6. This process continues until the voltage at Vout stabilizes at the same or similar value as that of the reference voltage at Vref.

Although this basic voltage regulator circuit can supply high currents or power to the output terminal Vout, for present day performance requirements the time elapse between the demand for high power from the output terminal Vout and the time at which this basic regulator circuit can supply the required high power is too long. Today's and future integrated semiconductor circuits cannot tolerate such long delays. Thus, in accordance with the teachings of this invention, the high power control transistor T13 has been added to the voltage regulator system to provide high power or large currents to the output terminal Vout in a much shorter period of time than can be provided by the basic voltage regulator circuit 10 and T6.

Figure 2:
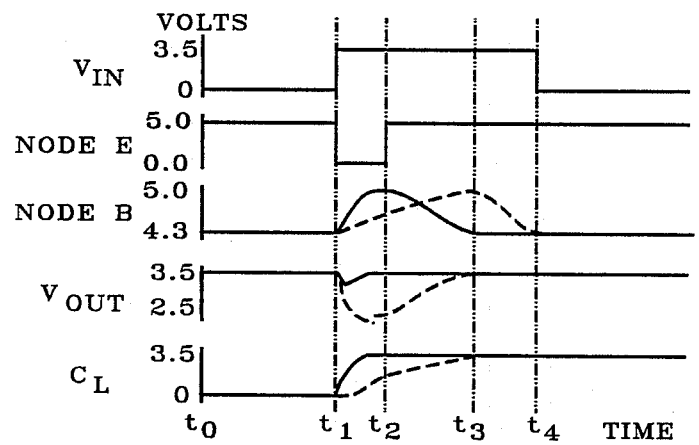

For a better understanding of the operation of the voltage regulator with power boost system of the present invention, reference may be had to the pulse program illustrated in FIG. 2 of the drawing, along with the circuit diagram shown in FIG. 1. At time t0 of the pulse program shown in FIG. 2, the voltage at the reference terminal Vref is at 3.5 volts and the voltage at the output voltage Vout has stabilized at the same voltage 3.5 volts in the manner described hereinabove in connection with the operation of the basic voltage regulator 10 and T6. The voltage at node E or at the gate or control electrode of the high power control transistor T13 is high, approximately at 5.0 volts, turning off the control transistor T13 since the transistor T11 of the inverter stage 18 is on. Also, at time t0 the voltage at the input terminal Vin is low or at 0 volts and the voltage across the large capacitive load $C_L$ or at the node D is low or at 0 volts, with the voltage at node B of the differential amplifier 10 being at approximately 4.3 volts, or at a voltage of 3.5 volts plus the threshold voltage of the output transistor T6, sufficient to turn on the control transistor T6 so as to maintain the voltage at the output terminal Vout at about 3.5 volts during standby.

When it is desired to charge the load $C_L$ to a high voltage, i.e., to approximately 3.5 volts, at time t1 the voltage at the terminal Vin is increased to 3.5 volts to turn on the monostable or single shot multivibrator circuit 16 which, for a given time interval, turns on the N-channel transistor T12 of the inverter stage 18 lowering the voltage at node E of the inverter stage 18 to turn on the high power control transistor T13. With the control transistor T13 turned on, the voltage at node B of the differential amplifier 10 increases rapidly to quickly turn on hard the output transistor T6, which supplies a large amount of current to the output terminal Vout and in turn to the large capacitive load $C_L$, which is coupled to the output terminal Vout, to rapidly increase the voltage on the load $C_L$, as indicated in FIG. 2 of the drawing by the solid line. The voltage at the monostable multivibrator circuit output then returns to its initial low state and the voltage at node E returns to approximately 5.0 volts, turning off the high power control transistor T13. With the control transistor T13 being off, the differential amplifier 10 again controls the output transistor T6.

It should be noted that while the input signal or pulse at the input terminal Vin is applied to the input terminal of the monostable multivibrator circuit 16, it is also being applied to the input of the delay circuit 14. After a predetermined delay in the delay circuit 14, the high voltage is applied to the first inverter I1 where it turns on the N-channel transistor T8 to lower the voltage at node C which turns on the P-channel transistor T9 to connect the output terminal Vout to the large capacitive load $C_L$. It should be understood that the time of delay in the delay circuit 14 should be such that the P-channel transistor T9 of the second inverter I2 turns on very shortly after the N-channel output transistor T6 is turned on hard by the P-channel control transistor T13, and that the width of the pulse produced by the monostable multivibrator circuit 16, indicated by the width of the pulse at node E, i.e., the difference in time between times t1 and t2 in the pulse program of FIG. 2, is wide enough to provide on the load $C_L$ a full charge of 3.5 volts. The voltage at the input terminal Vin should remain high for at least the duration of the time that the load capacitor $C_L$ is charged.

It should be noted in FIG. 2 as indicated by the solid line that the large capacitive load $C_L$ is fully charged to 3.5 volts between times t1 and t2, which may be of a time span of no more than 5 nanoseconds, whereas the time required to fully charge the load $C_L$ to 3.5 volts by the known basic voltage regulator 10 and T6 is from time t1 to time t3, which may be as long as 10 nanoseconds, as indicated by the dashed line in graph $C_L$ of FIG. 2. The basic voltage regulator circuit 10 and T6 requires more time to fully charge the load $C_L$ because more time is required to increase the voltage at node B of the differential amplifier 10, as indicated in the graph of the voltage at node B by the dashed line extending between times t1 and t3, which may be a span of 10 nanoseconds. The time for the voltage at the output terminal Vout to fully recover to the 3.5 volt level when only the basic voltage regulator circuit is used is also indicated as a dashed line between times t1 and t3 in the graph of Vout in FIG. 2 of the drawings. It should be noted that due to the very high charge demand from the very large capacitive load $C_L$, even the voltage at the output terminal Vout in the system of the present invention decreases somewhat between times t1 and t3, but this decrease, generally no greater than 0.2 volts, is very small compared with the decrease, often equal to at least 0.8 volts for similarly large capacitive loads, experienced at the output terminal Vout of the basic voltage regulator circuit 10 and T6. After the load $C_L$ has been fully charged, the voltage at node B returns to approximately 4.3 volts, or to the voltage at the output terminal Vout plus the threshold voltage of the output transistor T6, and the voltage at the output terminal Vout remains stable at about 3.5 volts, with the voltage across the capacitive load remaining also at 3.5 volts, until the voltage state at input terminal Vin changes and subsequently the capacitive load $C_L$ is discharged to ground through the N-channel transistor T10 of the second inverter of the driver circuit 12.

Although a driver circuit 12 connected to a capacitive load $C_L$ has been shown as circuitry connected to the output terminal Vout, it should be understood that any capacitive load may be coupled to the output terminal Vout which must be charged at some particular time initiated by an input signal or pulse which is applied to the circuit to be charged and to the circuit which can quickly turn on the output transistor hard. Furthermore, although a differential amplifier has been illustrated which utilizes a current mirror circuit, it should be understood that any appropriate amplifier can be used for stabilizing the voltage at the output terminal Vout during intervals when a high current is not required for charging the circuit coupled to the output terminal Vout.

Likewise, it should be noted that the N-channel output transistor T6 may be replaced by some other type of transistor, e.g., a P-channel field effect transistor. When the output transistor is a P-channel transistor, the gate or control electrode of the P-channel output transistor should be connected to node A instead of to node B and the control transistor T13 should be an N-channel field effect transistor having its drain electrode connected to the gate or control electrode of the P-channel output transistor T6 and its source electrode connected to a point of fixed potential such as ground, with suitable circuitry provided to turn on the N-channel control transistor T13 when high charging currents are required by the load circuit coupled to the output terminal Vout.

Accordingly, it can be seen that a voltage regulator with power boost system has been provided which anticipates the need for a large supply of charging current from an output voltage terminal having a lower voltage than that of the external power supply on the chip and supplies it quickly to the capacitive load, yet uses very little power during standby conditions.

While the invention has been particularly shown and described with reference to preferred embodiments thereof, it will be understood by those skilled in the art that various changes in form and details may be made therein without departing from the spirit and scope of the invention.

What is claimed is:

1. A system comprising
    a differential amplifier having first and second inputs and an output,
    a voltage supply terminal having a supply voltage of a given magnitude connected to said differential amplifier,
    a reference terminal having a fixed voltage connected to the first input of said differential amplifier,
    an output transistor having a control electrode coupled to the output of said differential amplifier, a first current carrying electrode coupled to the second input of said differential amplifier and a second current carrying electrode coupled to said voltage supply terminal,
    a control transistor having a control electrode, a first current carrying electrode coupled to the control electrode of said output transistor and a second current carrying electrode coupled to a point of fixed potential, and
    means coupled to the control electrode of said control transistor for selectively turning on said control transistor.

2. A system as set forth in claim 1 wherein said differential amplifier includes a current mirror.

3. A system as set forth in claim 1 wherein said output transistor is an N-channel field effect transistor.

4. A system as set forth in claim 3 wherein said control transistor is a P-channel field effect transistor and said second current carrying electrode is connected to said voltage supply terminal.

5. A system as set forth in claim 1 wherein said means includes a monostable multivibrator circuit and an input terminal coupled to the control electrode of said control transistor through said monostable multivibrator circuit.

6. A system as set forth in claim 5 further including
    a load having a capacitor and an input coupled to said input terminal, said load being interposed between the first current carrying electrode of said output transistor and a point of fixed potential.

7. A system as set forth in claim 6 wherein said load further includes a driver circuit having an input coupled to said input terminal and an output connected to said capacitor.

8. A system as set forth in claim 7 further including
    a delay circuit having an input connected to said input terminal and an output coupled to the input of said driver circuit.

9. A system as set forth in claim 5 wherein said monostable multivibrator circuit includes an input and an output and said means further includes an inverter stage having an input coupled to the output of said monostable multivibrator circuit and an output coupled to the control electrode of said control transistor, the input of said monostable multivibrator circuit being coupled to said input terminal.

10. A system as set forth in claim 9 wherein said inverter stage is interposed between the first current carrying electrode of said output transistor and a point of fixed potential.

11. A system as set forth in claim 7 wherein said driver circuit includes first and second inverters, each of said inverters having an input and an output, the input of said first inverter being coupled to said input terminal, the output of said first inverter being connected to the input of said second inverter and the output of said second inverter being connected to said capacitor.

12. A system as set forth in claim 11 further including a delay circuit having an input connected to said input terminal and an output connected to the input of said first inverter.

13. A voltage regulator system comprising
a differential amplifier having first and second inputs and an output,
a voltage supply terminal having a supply voltage of a given magnitude connected to said differential amplifier,
a reference terminal having a fixed voltage connected to the first input of said differential amplifier,
an output transistor having a control electrode couple to the output of said differential amplifier, a first current carrying electrode connected to the second input of said differential amplifier and a second current carrying electrode coupled to said voltage supply terminal,
a control transistor having a control electrode, a first current carrying electrode connected to the control electrode of said output transistor, and a second current carrying electrode connected to a point of fixed potential,
a load circuit including a capacitor coupled between the first current carrying electrode of said output transistor and a point of fixed potential, and
means including an input terminal having a signal applied thereto for turning on said control transistor at a predetermined instant of time and for activating said load circuit to charge said capacitor at a time subsequent to said predetermined instant of time.

14. A voltage regulator system as set forth in claim 13 wherein said differential amplifier includes a current mirror.

15. A voltage regulator system as set forth in claim 14 wherein said output transistor is an N-channel field effect transistor and said control transistor is a P-channel field effect transistor having its second current carrying electrode connected to said voltage supply terminal.

16. A voltage regulator system as set forth in claim 15 wherein said load circuit includes a driver circuit having an input coupled to said input terminal and an output connected to said capacitor.

17. A voltage regulator system as set forth in claim 16 wherein said driver circuit includes a first inverter having an input coupled to said input terminal and an output and a second inverter having an input connected to the output of said first inverter and an output connected to said capacitor.

18. A voltage regulator system as set forth in claim 17 wherein said second inverter includes a P-channel field effect transistor serially connected with an N-channel field effect transistor, the P-channel field effect transistor of said second inverter coupling said capacitor to the first current carrying electrode of said output terminal.

19. A voltage regulator system as set forth in claim 18 wherein said means further includes
a monostable multivibrator circuit having an input connected to said input terminal and an output and
an inverter stage having a P-channel field effect transistor serially connected with an N-channel field effect transistor, the P-channel transistor of said inverter stage having a control electrode connected to ground and the N-channel transistor of said inverter stage having a control electrode connected to the output of said monostable multivibrator; the P-channel transistor of said inverter stage being arranged to couple said voltage supply terminal to the control electrode of said control transistor.

20. A voltage regulator system as set forth in claim 19 further including
a delay circuit having an input connected to said input terminal and an output connected to the input of said first inverter of said driver circuit.

21. A voltage regulator system comprising
first and second points of fixed potential,
first, second and third P-channel field effect transistors and first, second, third and fourth N-channel field effect transistors, each of said transistors having a control electrode and first and second current carrying electrodes, said first P-channel transistor and said first and second N-channel transistors being serially connected between said first and second points of fixed potential, with said first N-channel transistor being interposed between said first P-channel transistor and said second N-channel transistor and said first P-channel transistor being connected to said first point of fixed potential and said second N-channel transistor being connected to said second point of fixed potential, and said second P-channel transistor being serially connected with said third N-channel transistor from said first point of fixed potential to the common point between said first and second N-channel transistors, said second P-channel transistor being connected to said first point of fixed potential, each of the control electrodes of said first and second P-channel transistors being connected to the common point between said first P-channel transistor and said first N-channel transistor, said third P-channel transistor being connected in parallel with said second P-channel transistor and said fourth N-channel transistor being connected between said first point of fixed potential and the control electrode of said third N-channel transistor, the control electrode of said fourth N-channel transistor being connected to the common point between said second P-channel transistor and said third N-channel transistor,
a point of reference potential connected to the control electrodes of said first and second N-channel transistors, an output terminal connected to the control electrode of said third N-channel transistor, a load circuit having a capacitor connected between said second point of fixed potential and said output terminal, and means including an input terminal having a signal applied thereto and coupled to said load circuit for coupling said capacitor to said output terminal at a given instant of time and coupled to the control electrode of said third P-channel transistor to turn on said third P-channel transistor prior to said given instant of time.

22. A voltage regulator system comprising first means for receiving a power supply voltage, second means for receiving a constant voltage, the constant voltage being of a magnitude different from that of the power supply voltage, a load, a transistor having a gate electrode, a drain electrode coupled to the first means and a source electrode coupled to the load, third means coupled between the second means and the gate electrode of the transistor for setting the voltage of the load to the constant voltage, and fourth means responsive to a control signal for generating a turn-on pulse when the constant voltage is to be initially applied to the load, the fourth means supplying the turn-on pulse to the gate electrode of the transistor so that the load is charged by the supply voltage for the duration of the turn-on pulse, whereby the transistor is controlled by the fourth means to charge the load during the turn-on period and whereby the transistor is controlled by the second means to clamp the voltage of the load to the constant voltage during a steady-state period.

* * * * *